United States Patent [19]
Mosley et al.

[11] Patent Number: 5,982,632
[45] Date of Patent: Nov. 9, 1999

[54] SHORT POWER SIGNAL PATH INTEGRATED CIRCUIT PACKAGE

[75] Inventors: Larry Mosley, San Jose, Calif.; Anna Madrid, Phoenix; Siva Natarajan, Gilbert, both of Ariz.

[73] Assignee: Intel Corporation, Santa Clara, Calif.

[21] Appl. No.: 09/007,349

[22] Filed: Jan. 15, 1998

Related U.S. Application Data

[63] Continuation of application No. 08/604,191, Feb. 21, 1996, abandoned, which is a continuation of application No. 08/377,778, Jan. 24, 1995, abandoned.

[51] Int. Cl.$^6$ .............................. H05K 1/11; H05K 1/14; H05K 7/02
[52] U.S. Cl. .................... 361/775; 174/261; 257/691; 257/728; 257/786; 361/777; 361/774
[58] Field of Search ....................... 174/51, 52.1, 52.4, 174/250, 253, 255, 260, 261, 262; 228/180.21, 180.22; 257/678, 690, 691, 692–693, 698, 700, 723, 724, 728, 659, 660, 737, 738, 773, 778, 780, 786; 324/755, 765, 771; 361/748, 760, 761, 764, 772, 773, 774, 775, 777, 778, 779, 780, 782, 783, 807, 809, 820

[56] References Cited

U.S. PATENT DOCUMENTS

| | | |
|---|---|---|
| 4,513,355 | 4/1985 | Schroeder et al. . |
| 4,560,826 | 12/1985 | Burns et al. . |
| 4,587,548 | 5/1986 | Grabbe et al. ........................ 257/691 |
| 4,608,592 | 8/1986 | Miyamoto ............................. 257/691 |
| 4,972,253 | 11/1990 | Palino et al. ........................ 257/678 |
| 5,016,085 | 5/1991 | Hubbard et al. . |
| 5,036,163 | 7/1991 | Spielberger et al. . |
| 5,066,831 | 11/1991 | Spielberger et al. . |
| 5,285,352 | 2/1994 | Pastore et al. . |
| 5,444,298 | 8/1995 | Schutz . |
| 5,468,994 | 11/1995 | Pendse ................................. 257/693 |
| 5,473,190 | 12/1995 | Inoue et al. ......................... 257/691 |
| 5,483,099 | 1/1996 | Natarajan et al. ................... 257/691 |
| 5,502,278 | 3/1996 | Mabboux et al. . |
| 5,545,923 | 8/1996 | Barber ................................. 257/691 |
| 5,581,122 | 12/1996 | Chao et al. .......................... 257/691 |
| 5,633,529 | 5/1997 | Otsuki ................................. 257/698 |
| 5,650,660 | 7/1997 | Barrow ................................ 257/786 |
| 5,672,911 | 9/1997 | Patil et al. ........................... 257/691 |
| 5,686,699 | 11/1997 | Chu et al. ............................ 257/786 |
| 5,691,568 | 11/1997 | Chou et al. .......................... 257/700 |
| 5,798,571 | 8/1998 | Nakajima ............................. 257/691 |
| 5,825,084 | 10/1998 | Lau et al. ............................ 257/700 |
| 5,841,191 | 11/1998 | Chia et al. ........................... 257/690 |

FOREIGN PATENT DOCUMENTS 3258101  11/1991  Japan .

*Primary Examiner*—Donald Sparks
*Attorney, Agent, or Firm*—Blakely, Sokoloff, Taylor & Zafman

[57] ABSTRACT

A short power signal path integrated circuit package placed on a printed circuit (PC) board and having a first dielectric layer. On top of this first dielectric layer a metallized die pad and a first metal ring, surrounding this metallized die pad, are positioned. The metallized die pad and the first metal ring electrically couple to the PC board to receive respectively a first power supply signal and a second power supply signal. An integrated circuit die is then affixed to the metallized die pad. This integrated circuit die has a first power supply signal bond pad and a second power supply signal bond pad, which respectively are coupled to the metallized die pad and the first metal ring. Consequently, the metallized die pad and the first metal ring operate as a first power supply plane and a second power supply plane coupling the first and the second power supply signals coming from the PC board to the first and the second power supply signal bond pads on the integrated circuit die.

26 Claims, 2 Drawing Sheets

SHORT POWER SIGNAL PATH INTEGRATED CIRCUIT PACKAGE

This is a continuation of application Ser. No. 08/604,191 filed Feb. 21, 1996, now abandoned, which is a continuation of application Ser. No. 08/377,778 filed Jan. 24, 1995, now abandoned.

BACKGROUND OF THE INVENTION

1. Field of the Invention

The present invention relates to the field of high performance integrated circuit packaging.

2. Art Background

Traditionally, microprocessors have been packaged in ceramic pin grid array packages because of electrical and thermal performance requirements. More specifically, the high instruction execution speed of microprocessors places two limitations on the design of packaging for microprocessors. First, since power consumption is a function of the instruction execution speed and since microprocessors operate at high instruction execution speeds, the conservation of energy is one limitation placed on the design of packaging for microprocessors. Second, the high instruction execution speed of microprocessors requires the packaging to minimize the time for removing and supplying the transient power supply currents (e.g., the transient ground and the transient $V_{CC}$ supply currents) to the microprocessor die, in order to allow the circuit nodes to charge and discharge as quickly as possible.

The conservation of energy and time constraints can both be satisfied by providing the shortest paths from the printed circuit (PC) board to the die for the power supply signals (e.g. the ground supply signal and the $V_{CC}$ supply signal). In other words, energy is conserved by minimizing the distance that the power supply signals have to traverse from the PC board to the die, because the power supply signals encounter less obstructions (i.e., resistance and inductance) in the path. Furthermore, the time for supplying and removing the transient power supply currents from the PC board to the die is also minimized by minimizing the distance that the power supply signals have to traverse from the PC board to the die.

In the past, microprocessors have been packaged mostly in ceramic pin grid array packages, because the prior art solutions for shortening the power supply signal paths (from the PC board to the die) often cannot be successfully implemented in other types of packaging. One prior art method for shortening the power signal paths is the placement of capacitive electrical planes within the package. These capacitive electrical planes (which are also called thin layer capacitors) are connected to the power supply signals, and thus provide a local on-chip power source that can be quickly accessed by the die.

Unfortunately, capacitive electrical planes can only be implemented in a few types of materials. The feasibility of implementing capacitive electrical planes depends on the minimum separation distance that can be achieved between each power and ground plane and the dielectric constant of the package. Thus, since ceramic packages have high dielectric constants and provide for small separation distances, capacitive electrical planes can be implemented in ceramic packages. However, as mentioned above, capacitive electrical planes cannot be implemented in all types of packages. For example, the cheaper plastic package technology cannot use capacitive electrical planes to shorten the power supply signal paths, because plastic packages have a low dielectric constant and cannot provide small separation distances between adjacent electrical planes.

Another prior art solution for shortening the paths of the power supply signals is to mount chip capacitors on the package, and to couple these capacitors to the power supply signals so that these capacitors act as local sources of power. However, as the chip capacitors are expensive, this prior art solution increases the processing cost of the microprocessors.

Consequently, it would be desirable to provide a packaging method and apparatus for microprocessors that would cost effectively conserve energy and time in delivering the power supply signals from the PC board to the die. More specifically, a packaging method and apparatus for microprocessors is needed that would provide the shortest power signal paths from the PC board to the die without the use of capacitive electrical planes (which cannot be implemented in all types of packaging) and without the use of chip capacitors (which are expensive).

SUMMARY OF THE INVENTION

It is an object of the present invention to provide a packaging method and apparatus for microprocessors that would cost effectively conserve energy and time in delivering power supply signals from the PC board to the die. More specifically, it is an object of the present invention to provide a packaging method and apparatus for microprocessors that would provide for the shortest power signal paths from the PC board to the die without the use of capacitive electrical planes and without the use of chip capacitors.

These and other objects of the present invention are accomplished by a short power signal path integrated circuit package which is placed on a printed circuit (PC) board. This short power signal path package has a first dielectric layer, on top of which a metallized die pad and a first metal ring, surrounding this metallized die pad, are positioned. The metallized die pad and the first metal ring electrically couple to the PC board to receive respectively a first power supply signal and a second power supply signal. An integrated circuit die is then affixed to the metallized die pad. This integrated circuit die has a first power supply signal bond pad and a second power supply signal bond pad, which respectively are coupled to the metallized die pad and the first metal ring. Consequently, the metallized die pad and the first metal ring operate as a first power supply plane and a second power supply plane coupling the first and the second power supply signals coining from the PC board to the first and the second power supply signal bond pads on the integrated circuit die.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

The present invention provides an integrated circuit packaging method and apparatus that takes advantage of the high performance qualities of ball grid array (BGA) packages. More specifically, since solder balls can be affixed to integrated circuit packages with relatively small distances (e.g., 50 mils) between adjacent balls, BGA packages have a high solder ball density. In turn, the high solder ball density of BGA packages allow them to have a relatively small size. As described below, the package design of the present invention then utilizes the high solder ball density and small size of BGA packages to provide the shortest power supply signal paths.

In the following description, for purposes of explanation numerous details are set forth in order to provide a thorough understanding of the present invention. However, it will be apparent to one skilled in the art that these specific details are not required in order to practice the invention. For example, although the following description of the invention is with respect to BGA packages, it will be understood by one skilled in the art that pin grid array (PGA) packages can be used to implement the present invention if their pin density and adjacent pin spacing are comparable to the ball density and adjacent ball spacing of BGA packages.

Figure 1:
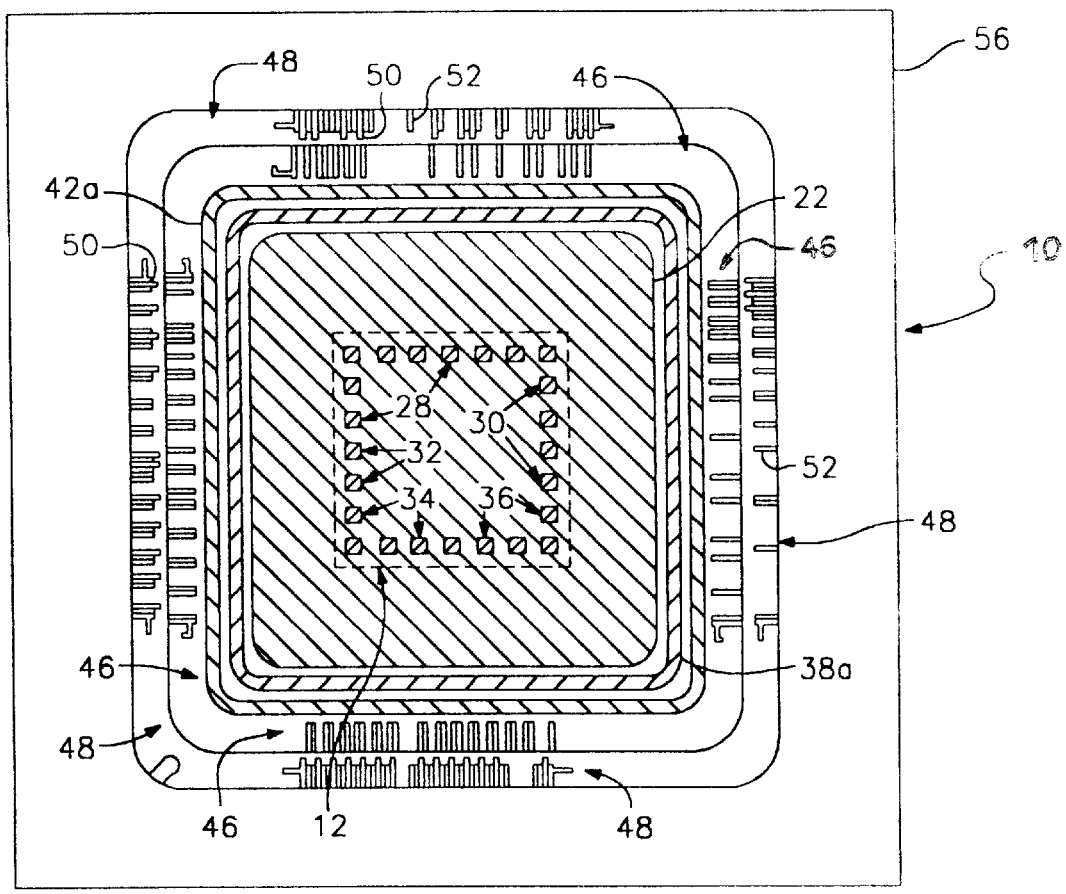
FIG. 1 presents a top view of a ball grid array package for one embodiment of the present invention.
Figure 2:
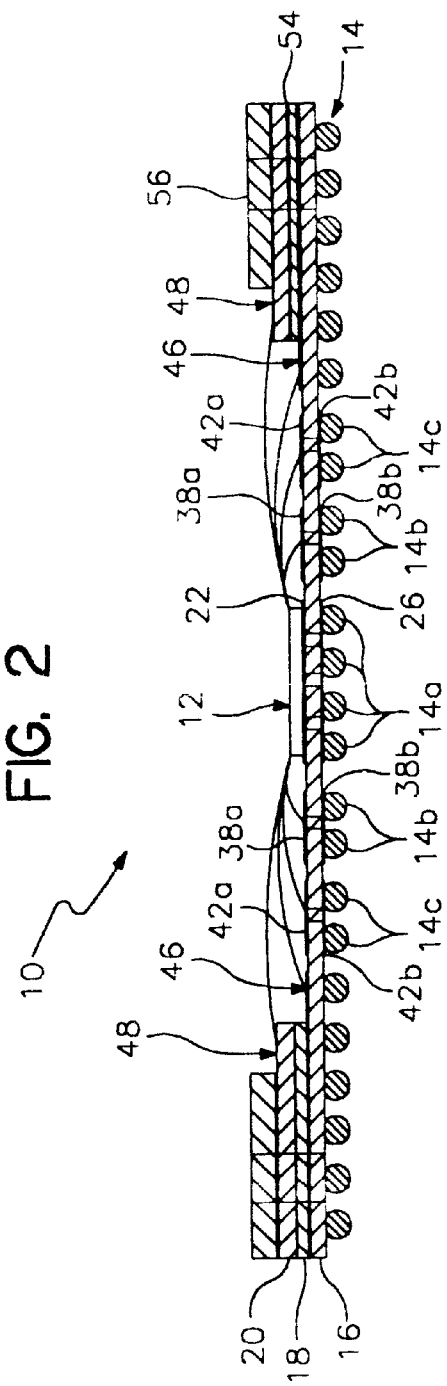
FIG. 2 presents a side cross-sectional view of the ball grid array package of FIG. 1.
Figure 3:
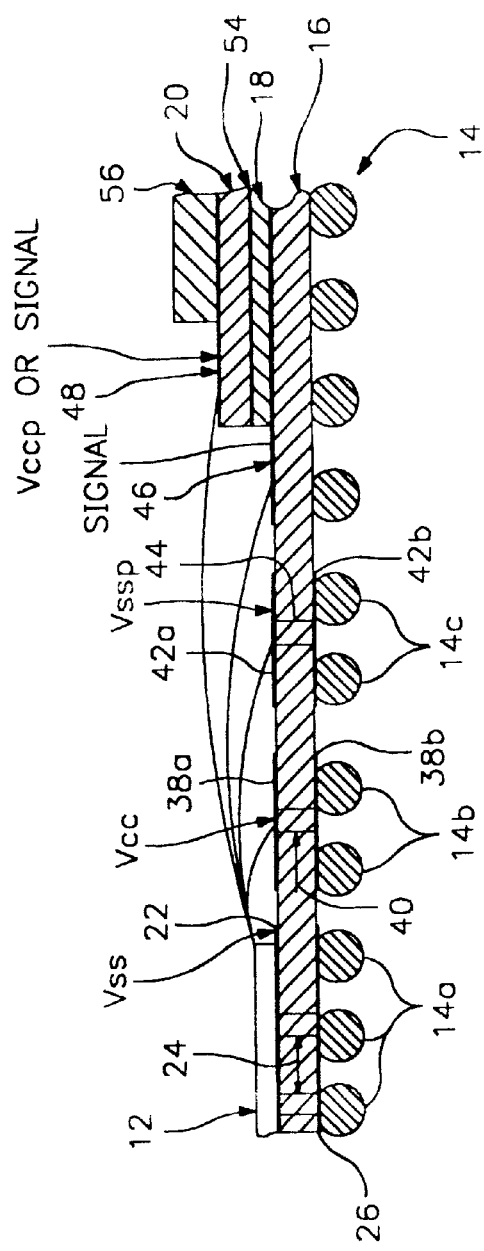
FIG. 3 presents an enlarged cross-sectional view of the ball grid array package of FIG. 1.

FIGS. 1–3 present one embodiment of the packaging method and apparatus of the present invention. As shown in these figures, plastic package 10 houses an integrated circuit 12, which in one embodiment of the present invention is a microprocessor. In addition, although a plastic package is described for the embodiment of the present invention that is set forth in FIGS. 1–3, it is to be understood that package 10 may be composed of other types of material. Package 10 has a plurality of connectors 14 which are affixed to the bottom surface of the package. These connectors form contacts with metal pads on a PC board, and thereby couple package 10 to the PC board. For the embodiment of the present invention that is set forth in FIGS. 1–3, the connectors are solder balls. However, as mentioned before, other types of connectors (e.g., pins) can be used if their density and adjacent spacing are comparable to the ball density and adjacent ball spacing of BGA packages.

For the embodiment of the present invention that FIGS. 1–3 set forth, package 10 has the following three layers of dielectric material: first dielectric layer 16, second dielectric layer 18, and third dielectric layer 20. On the top surface of the first dielectric layer of package 10, first metallized die pad 22 is affixed to package 10. In one embodiment of the present invention, first metallized die pad 22 is affixed to package 10 through a lamination process. This die pad is electrically and thermally, connected through plated vias 24 to second metallized pad 26, which is attached to the bottom surface of first dielectric layer 16. In turn, through solder balls 14a coupled to second metallized pad 26, first metallized die pad 22 couples to a first power supply signal on the PC board. In the embodiment of the present invention that is set forth in FIGS. 1–3, the first power supply signal is the core ground supply signal $V_{SS}$. However, it is to be understood that the first power supply signal can be any one of a number of different types of power supply signals.

Microprocessor die 12 is then attached to first metallized die pad 22 by an electrically and thermally conductive adhesive. Microprocessor die 12 contains a plurality of bond pads including core ground bond pads 28, peripheral ground bond pads 30, core $V_{CC}$ bond pads 32, peripheral $V_{CC}$ bond pads 34, and individual signal bond pads 36. The core ground bond pads are all shorted together by wire bonding them to die pad 22. Thus, a shortest electrical (i.e., lowest inductance) path from the core ground bond pads on the die to the core ground supply signal on the PC board is established through first metallized die pad 22, vias 24, second metallized pad 26, and solder balls 14a. This shortest path is independent of the die size and package size.

Package 10 also includes a first set of metal rings 38 that surround the metallized pads on both the top and bottom sides of first dielectric layer 16. Top side ring 38a and bottom side ring 38b of the first set of metal rings are electrically and thermally connected together through plated vias 40. Through solder balls 14b, the bottom side first metal ring couples to a second power supply signal on the PC board. In the embodiment of the present invention that is set forth in FIGS. 1–3, the second power supply signal is the core $V_{CC}$ supply signal. However, it is to be understood that the second power supply signal can be any one of a number of different types of power supply signals. The core $V_{CC}$ bond pads on the microprocessor die are all shorted together by wire bonding them to the top first metal ring. Thus, a short electrical (i.e., a low inductance) path from the core $V_{CC}$ bond pads on the die to the core $V_{CC}$ supply signal on the PC board is established through top first metal ring 38a, vias 40, bottom first metal ring 38b, and the solder balls 14b.

As further shown in the figures, package 10 also includes second set of metal rings 42 that surround the metallized pads and first set of metal rings on both the top and bottom surfaces of the first dielectric layer 16. Top side ring 42a and bottom side ring 42b of the second set of metal rings are electrically and thermally connected together through plated vias 44. The bottom side second metal ring is coupled to a third power supply signal on the PC board through solder balls 14c that are attached to it. In the embodiment of the present invention that is set forth in FIGS. 1–3, the third power supply signal is the peripheral ground supply signal $V_{SSP}$. However, it is to be understood that the third power supply signal can be any one of a number of different types of power supply signals.

The peripheral ground bond pads on the microprocessor die are all shorted together by wire bonding them to the top second metal ring. In this manner, the second set of metal rings is used to couple the peripheral ground bond pads on the die to the peripheral ground supply signal on the PC board. This embodiment of the present invention provides peripheral power supply connections in order to isolate the power supplies that are used by the microprocessor's core activities (e.g., instruction executions) from the "noisier" power supplies that are used for the microprocessor's peripheral activities (e.g., communication with other devices).

As further shown in the figures, package 10 also has two rows of bond fingers. The first row of bond fingers 46 is placed on the top surface of the first dielectric layer 16 (which constitutes a first lower bonding shelf) along with the metallized die pad 22, first top metal ring 38a, and second top metal ring 42a. The first row of bond fingers 46 has a number of individual signal bond fingers which are used for individual signal connections. More specifically, a specific signal bond pad on the microprocessor die can be coupled to a specific signal coming from the PC board through wire bonding the specific signal bond pad to a specific signal finger; in turn, the specific signal finger couples to an individual trace that traverses along the length or width of the package (i.e., traverses along either a portion of the length or width of the package or the entire length or width of the package) to an individual via and an individual solder ball that receive the specific signal on the PC board.

Second row of bond fingers 48 is placed on the top surface of the third dielectric layer 20 (constituting a second higher bonding shelf), which itself is positioned on top of the second dielectric layer 18. As shown in FIGS. 1–3, the second and third dielectric layers surround first metallized die pad 22, first top metal ring 38a, second top metal ring 42a, and first row of bond fingers 46. In addition, the second and third dielectric layers are offset from the central axis of the package by a predetermined amount so as to allow the die pad, top metal ray and first row of bond fingers to be exposed.

The second row of bond fingers includes two types of bond fingers. The first type of bond fingers are fourth power supply bond fingers 50, which are shown in FIG. 1 as the longer bond fingers. These fourth power supply bond fingers traverse the edge of the cavity formed by first, second, and third dielectric layers and couple to metallized plane 54 which is positioned in between the top surface of the second dielectric layer and the bottom surface of the third dielectric layer. This metallized plane through at least one via couples to at least one solder ball, which in turn couples to a fourth power supply signal on the PC board. In this manner, metallized plane 54 shorts all fourth power supply fingers to the fourth power supply signal.

In the embodiment of the present invention that is set forth in FIGS. 1–3, the fourth power supply signal is the peripheral $V_{CC}$ supply signal ($V_{CCP}$). However, it is to be understood that the fourth power supply signal can be any one of a number of different types of power supply signals. In addition, as mentioned before, this embodiment of the present invention provides peripheral $V_{CC}$ supply signal connections in order to separate the $V_{CC}$ supply signal used for the core activities of the microprocessor from the "noisier" $V_{CC}$ supply signal used for the peripheral activities of the microprocessor.

In the embodiment of the present invention that is set forth in FIGS. 1–3, the second row of bond fingers also include a second type of bond fingers. However, it is to be understood that in alternative embodiments of the present invention, the second row of bond fingers could include only the fourth power supply bond fingers. In the embodiment set forth in FIGS. 1–3, the second type of bond fingers on the second row are additional individual signal bond fingers 52, whereby each specific signal finger couples a specific signal bond pad on the microprocessor die to a specific signal coming from the PC board through a wire interconnect, a particular trace (traversing the length or width of the package), a particular via, and a particular solder ball. In this embodiment, the second row of individual signal bond fingers are provided in order to allow adjacent individual signal bond pads on the die to couple to individual signal bond fingers. More specifically, since currently the minimum spacing that can be achieved between individual bond fingers is 200 microns, while the minimum separation that can be achieved between individual bond pads is 100 microns, this embodiment of the present invention provides a second row of signal fingers so as to allow adjacent individual signal bond pads to couple to individual signal bond fingers. Finally, package 10 has plastic top 56 that further forms (along with the first, second, and third dielectric layers) the cavity in which a molding compound encapsulent is poured in order to enclose the top of the BGA package.

Figure 4:
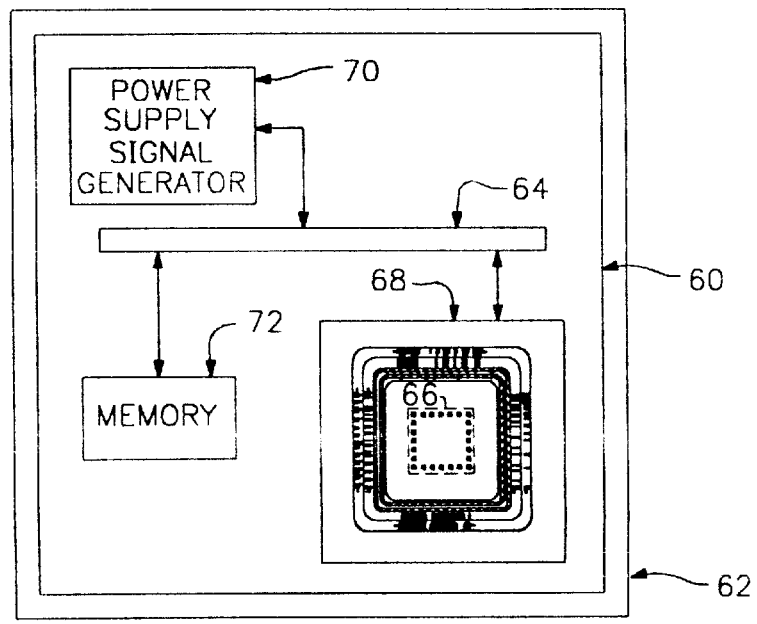
FIG. 4 presents the high performance integrated circuit package of the present invention housing a microprocessor of a general purpose computer system.

FIG. 4 presents the high performance integrated circuit package of the present invention housing a microprocessor of a general purpose computer system. As shown in this figure, computer system 60 is housed on printed circuit (PC) board 62 and includes bus 64, microprocessor 66, high performance microprocessor package 68, power supply signal generator 70, and memory 72. High performance microprocessor package 68 couples microprocessor 66 to bus 64 in order to communicate power supply signals and non-power supply signals between microprocessor 66 and devices coupled to bus 64. For the embodiment of the present invention shown in FIG. 4, bus 64 couples microprocessor 66 to memory 72 and power supply signal generator 70. However, it is to be understood that in alternative embodiments of the present invention, microprocessor 66 can be coupled to memory 72 and power supply signal generator 70 through two different buses. In addition, in alternative embodiments of the present invention, power supply signal generator 70 is not positioned on PC board 62 in order to couple to bus 64.

Thus, the present invention has numerous advantages. For example, by using the shortest paths from the die to the PC board as the power supply signal paths (i.e., by using the balls near the center of the package for $V_{CC}$ and ground connections), the present invention lowers the power loop inductance without using on-chip capacitors and capacitive electrical planes. In addition, since this design uses the balls near the center of the package for power supply connections and the balls from the outer rows of the package for the signal connections, the signal routing on the PC board is simplified (i.e., additional routing layers are not needed to route the balls near the center of the package). Furthermore, the method and apparatus of the present invention minimizes the multiple metal and substrate layers by placing the die pad, and first and second top metal rings on one bonding shelf (i.e., the first bonding shelf), which thereby makes areas outside the metal rings on the top side of the package available for signal connections.

It will be recognized that the above described invention may be embodied in other specific forms without departing from the spirit or essential characteristics of the disclosure. For example, although the description above is with respect to a package having two bonding shelves, it will be understood by one skilled in the art that alternative embodiments of the invention include integrated circuit packages having only one bonding shelf. For instance, one embodiment of the present invention has only one bonding shelf (1) because, instead of fourth power supply bond fingers 50 and metallized plane 54, it uses a third set of metal rings surrounding second set of metal rings 42 to couple fourth power supply bond pads 34 to the fourth power supply on the PC board, and (2) because it uses only one row of signal bond fingers (i.e., first row of signal bond fingers 46), surrounding metallized die pad 22, first top metal ring 36a, second top metal ring 42a, and the third top metal ring, to couple individual signal bond pads on the die to individual signals on the PC board. Thus, while certain exemplary embodiments have been described and shown in the accompanying drawings, it is to be understood that the invention is not to be limited by the foregoing illustrative details, but rather is to be defined by the appended claims.

I claim:

1. A short power signal path integrated circuit package comprising:

a) a first dielectric layer having a top and a bottom surface;

b) a top metallized pad disposed on the top surface of the first dielectric layer for electrically coupling to a PC board to receive a first power supply signal;

c) an integrated circuit die disposed on said top metallized pad so as to expose a portion of the top metallized pad, said integrated circuit die having a first power supply signal bond pad, a second power supply signal bond pad and a third power supply signal bond pad said first power supply signal bond pad coupled to the exposed portion of said top metallized pad;

d) a top first metal ring surrounding the top metallized pad, said top first metal ring disposed on the top surface of the first dielectric layer, the second power supply signal bond pad coupled to the top first metal ring;

e) a bottom first metal ring for receiving a second power supply signal, said bottom first metal ring disposed on the bottom surface of the first dielectric layer, said bottom first metal ring coupled to the top first metal ring;

f) a top second metal ring surrounding the top first metal ring, said top second metal ring disposed on the top surface of the first dielectric layer, the third power supply signal bond pad coupled to the top second metal ring; and g) a bottom second metal ring for receiving a third power supply signal, said bottom second ring disposed on the bottom surface of the first dielectric layer, said bottom second metal ring coupled to the top second metal ring.

2. The short power signal path integrated circuit package of claim 1, wherein the integrated circuit die further has a first non-power supply signal bond pad, the package further comprising a first row of bond fingers surrounding the top second metal ring, said first row of bond fingers having a first bond finger for receiving a first non-power supply signal, said first non-power supply signal bond pad coupled to said first bond finger.

3. The short power signal path integrated circuit package of claim 2, wherein the integrated circuit die further has a fourth power supply signal bond pad, the package further comprising:

a) a second dielectric layer positioned on top of the top surface of the first dielectric layer so as to expose the top metallized die pad, the top metal rings, and the first row of bond fingers;

b) a third dielectric layer positioned on top of the second dielectric layer so as to expose the top metallized die pad, the top metal rings, and the first row of bond fingers; and c) a second row of bond fingers positioned on top of the third dielectric layer, the second row of bond finger having a second bond finger for receiving a fourth power supply signal, said second bond finger coupled to said fourth power supply signal bond pad.

4. The short power signal path integrated circuit package of claim 3 further comprising a metallized plane positioned in between the second and third dielectric layers, said metallized plane for coupling said fourth power supply signal to said second bond finger.

5. The short power signal path integrated circuit package of claim 4, wherein the integrated circuit die further has a second non-power supply signal bond pad, the second row of bond fingers further having a third bond finger for receiving a second non-power supply signal said third bond finger coupled to said second non-power supply signal bond pad.

6. The short power signal path integrated circuit package of claim 4, wherein said integrated circuit is a microprocessor.

7. The short power signal path integrated circuit package of claim 4, wherein said package is a ball grid array package.

8. A computer system positioned on a printed circuit (PC) board, said computer system comprising:

a) a bus;

b) a memory coupled to said bus; and c) a short power signal path integrated circuit package coupled to said bus and to said PC board, said package including:

d) a first dielectric layer having a top and a bottom surface;

e) a top metallized pad disposed on the top surface of the first dielectric layer for electrically coupling to a PC board to receive a first power supply signal;

f) an integrated circuit die disposed on said top metallized pad so as to expose a portion of the top metallized pad, said integrated circuit die having a first power supply signal bond pad, a second power supply signal bond pad and a third power supply signal bond pad said first power supply signal bond pad coupled to the exposed portion of said top metallized pad;

g) a top first metal ring surrounding the top metallized pad, said top first metal ring disposed on the top surface of the first dielectric layer, the second power supply signal bond pad coupled to the top first metal ring;

h) a bottom first metal ring for receiving a second power supply signal, said bottom first metal ring disposed on the bottom surface of the first dielectric layer, said bottom first metal ring coupled to the top first metal ring;

i) a top second metal ring surrounding the top first metal ring, said top second metal ring disposed on the top surface of the first dielectric layer, the third power supply signal bond pad coupled to the top second metal ring; and j) a bottom second metal ring for receiving a third power supply signal, said bottom second ring disposed on the bottom surface of the first dielectric layer, said bottom second metal ring coupled to the top second metal ring.

9. The computer system of claim 8, wherein the integrated circuit die further has a first non-power supply signal bond pad, the package further comprising a first row of bond fingers surrounding the top second metal ring, said first row of bond fingers having a first bond finger for receiving a first non-power supply signal from the PC board, said first non-power supply signal bond pad coupled to said first bond finger.

10. The computer system of claim 9, wherein the integrated circuit die further has a fourth power supply signal bond pad, the package further comprising:

a) a second dielectric layer positioned on top of the top surface of the first dielectric layer so as to expose the top metallized die pad, the top metal rings, and the first row of bond fingers;

b) a third dielectric layer positioned on top of the second dielectric layer so as to expose the top metallized die pad, the top metal rings, and the first row of bond fingers; and c) a second row of bond fingers positioned on top of the third dielectric layer, the second row of bond finger having a second bond finger for receiving a fourth power supply signal, said second bond finger coupled to said fourth power supply signal bond pad.

11. The computer system of claim 10 wherein the package further comprises a metallized plane positioned in between the second and third dielectric layers, said metallized plane for coupling said fourth power supply signal to said second bond finger.

12. The computer system of claim 11, wherein the integrated circuit die further has a second non-power supply signal bond pad, the second row of bond fingers further having a third bond finger for receiving a second non-power supply signal from the PC board, said third bond finger coupled to said second non-power supply signal bond pad.

13. The computer system of claim 8, wherein said integrated circuit is a microprocessor.

14. The computer system of claim 8, wherein said package is a ball grid array package.

15. A short power signal path integrated circuit package for housing an integrated circuit die, the integrated circuit die having a first power supply signal bond pad and a second power supply bond pad and a third power supply signal bond pad, the package comprising:

a) a first dielectric layer having a first surface and a second surface;

b) a first metallized pad disposed on the first surface of the first dielectric layer, said integrated circuit die disposed on said first metallized pad;

c) a second metallized pad, disposed on the second surface of the first dielectric layer, said second metallized pad coupled to said first metallized pad for electrically coupling to a PC board to receive a first power supply signal to the first power supply signal bond pad through said first metallized pad;

d) a top first metal ring disposed on the first surface of the first dielectric layer and surrounding the first metallized pad, the second power supply bond pad coupled to the top first metal ring;

e) a bottom first metal ring disposed on the second surface of the first dielectric layer and surrounding the second metallized pad, said bottom first metal ring coupled to said top first metal ring for electrically coupling to the PC board to receive a second power supply signal to the second power supply signal bond pad through said top first metal ring;

f) a first row of bond fingers surrounding the top first metal ring, said first row of bond fingers having a first bond finger for receiving a first non-power supply signal and for coupling to said first non-power signal bond pad;

g) a second dielectric layer positioned on top of the first dielectric layer so as to expose the metallized die pad, the top first metal ring, and the first row of bond fingers; and h) a second row of bond fingers positioned on the second dielectric layer, the second row of bond finger having a second bond finger for receiving a third power supply signal and for coupling to said third power supply signal bond pad, wherein the integrated circuit die further has a first non-power supply signal bond pad, the package further comprising a first row of bond fingers surrounding the second metal ring, said first row of bond fingers having a first bond finger for receiving a first non-power supply signal and for coupling to said first non-power supply signal bond pad.

16. The short power signal path integrated circuit package of claim 15, wherein the integrated circuit die further has a fourth power supply signal bond pad, the package further comprising a second metal ring positioned between the top first metal ring and the first row of bond fingers, said second metal ring disposed on the first surface of the first dielectric layer, for electrically coupling to the PC board to receiver a fourth power supply signal and for coupling to said fourth power supply signal bond pad.

17. A short power signal path integrated circuit package for housing an integrated circuit die, the integrated circuit die having a first power supply signal bond pad, a second power supply bond pad, a third power supply signal bond pad, a fourth power supply signal bond pad, and a first non-power supply signal bond pad, the package comprising:

a) a first dielectric layer having a first surface and a second surface;

b) a first metallized pad disposed on the first surface of the first dielectric layer, said integrated circuit die disposed on said first metallized pad;

c) a second metallized pad, disposed on the second surface of the first dielectric layer, said second metallized pad coupled to said first metallized pad for electrically coupling to a PC board to receive a first power supply signal to the first power supply signal bond pad through said first metallized pad;

d) a top first metal ring disposed on the first surface of the first dielectric layer and surrounding the first metallized pad, the second power supply bond pad coupled to the first metal ring;

e) a bottom first metal ring disposed on the second surface of the first dielectric layer and surrounding the second metallized pad, said bottom first metal ring coupled to said top first metal ring for electrically coupling to the PC board to receive a second power supply signal to the second power supply signal bond pad through said top first metal ring;

f) a second metal ring disposed on the first surface of the first dielectric layer surrounding the top first metal ring, said second metal ring for electrically coupling to the PC board to receive a third power supply signal and for coupling to said third power supply signal bond pad;

g) a first row of bond fingers surrounding the second metal ring, said first row of bond fingers having a first bond finger for receiving a first non-power supply signal from the PC board and for coupling to said first non-power supply signal bond pad;

h) a second dielectric layer positioned on top of the first dielectric layer so as to expose the first metallized die pad, the top first metal ring, the second metal ring, and the first row of bond fingers; and i) a second row of bond fingers positioned on the second dielectric layer, the second row of bond finger having a second bond finger for receiving a fourth power supply signal and for coupling to said fourth power supply signal bond pad.

18. The short power signal path integrated circuit package of claim 17 further comprising:

a) a third dielectric layer positioned in between the first and the second dielectric layers; and b) a metallized plane positioned in between the second and the third dielectric layers, said metallized plane for coupling said fourth power supply signal to said second bond finger.

19. The short power signal path integrated circuit package of claim 17, wherein the integrated circuit die further has a second non-power supply signal bond pad, the second row of bond fingers further having a third bond finger for receiving a second non-power supply signal from the PC board and for coupling to said second non-power supply signal bond pad.

20. The short power signal path integrated circuit package of claim 17, wherein said integrated circuit is a microprocessor.

21. The short power signal path integrated circuit package of claim 17, wherein said package is a ball grid array package.

22. A short power signal path integrated circuit package comprising:
   a) a first dielectric layer having a first and a second surface;
   b) a first metallized pad, said first metallized pad disposed on the first dielectric layer;
   c) an integrated circuit die disposed on said first metallized pad so as to expose a portion of the first metallized pad, said integrated circuit die having a first power supply signal bond pad, a second power supply signal bond pad, a third power supply signal bond pad, and a fourth power supply signal bond pad, said first power supply signal bond pad coupled to the exposed portion of said first metallized pad;
   d) a second metallized pad, disposed on the second surface of the first dielectric layer, said second metallized pad coupled to said first metallized pad for electrically coupling to a PC board to receive a first power supply signal;
   e) a first top metal ring surrounding the metallized pad, said first top metal ring disposed on the first surface of the first dielectric layer, said second power supply signal bond pad coupled to the first top metal ring;
   f) a bottom first metal ring surrounding the second metallized pad, said bottom first ring disposed on the second surface of the first dielectric layer, said bottom first metal ring coupled to said first top metal ring for electrically coupling to the PC board to receive a second power supply signal;
   g) a second metal ring surrounding the first metal ring, said second metal ring disposed on the first dielectric layer, said second metal ring for receiving a third power supply signal, said third power supply signal bond pad coupled to the second metal ring;
   h) a first row of bond fingers surrounding the second metal ring, said first row of bond fingers having a first bond finger for receiving a first non-power supply signal from the PC board, said first non-power supply signal bond pad coupled to said first bond finger;
   i) a second dielectric layer positioned on top of the first dielectric layer so as to expose the first metallized die pad, the top first metal ring, the second metal ring, and the first row of bond fingers;
   j) a third dielectric layer positioned on top of the second dielectric layer so as to expose the first metallized die pad, the top first metal ring, the second metal ring, and the first row of bond fingers; and
   k) a second row of bond fingers positioned on the third dielectric layer, the second row of bond fingers having a second bond finger for receiving a fourth power supply signal, said second bond finger coupled to said fourth power supply signal bond pad.

23. The short power signal path integrated circuit package of claim 22 further comprising a metallized plane positioned in between the second and third dielectric layers, said metallized plane for coupling said fourth power supply signal to said second bond finger.

24. The short power signal path integrated circuit package of claim 22, wherein the integrated circuit die further has a second non-power supply signal bond pad, the second row of bond fingers further having a third bond finger for receiving a second non-power supply signal from the PC beard, said third bond finger coupled to said second non-power supply signal bond pad.

25. The short power signal path integrated circuit package of claim 22, wherein said integrated circuit is a microprocessor.

26. The short power signal path integrated circuit package of claim 22, wherein said package is a ball grid array package.

* * * * *